(12) United States Patent
Erez

(10) Patent No.: US 7,779,217 B2
(45) Date of Patent: Aug. 17, 2010

(54) SYSTEMS FOR OPTIMIZING PAGE SELECTION IN FLASH-MEMORY DEVICES

(75) Inventor: Eran Erez, Gedera (IL)

(73) Assignee: Sandisk IL Ltd., Kfar Saba (IL)

( * ) Notice: Subject to any disclaimer, the term of this patent is extended or adjusted under 35 U.S.C. 154(b) by 359 days.

(21) Appl. No.: 11/772,218

(22) Filed: Jun. 30, 2007

(65) Prior Publication Data
US 2008/0294869 A1 Nov. 27, 2008

Related U.S. Application Data

(60) Provisional application No. 60/939,090, filed on May 21, 2007.

(51) Int. Cl.
*G06F 12/00* (2006.01)
(52) U.S. Cl. ........................ 711/157; 711/103
(58) Field of Classification Search ............... 711/157, 711/103
See application file for complete search history.

(56) References Cited

U.S. PATENT DOCUMENTS

| | | | |
|---|---|---|---|
| 5,671,388 A | 9/1997 | Hasbun | 711/103 |
| 6,643,188 B2 | 11/2003 | Tanaka et al. | 365/189.01 |
| 7,583,545 B2 * | 9/2009 | Lasser | 365/189.16 |
| 2006/0155919 A1 | 7/2006 | Lasser et al. | 711/103 |
| 2008/0104309 A1 * | 5/2008 | Cheon et al. | 711/103 |

OTHER PUBLICATIONS

Datalight, "Technology Comparison: SLC and MLC Flash" Mar. 2004, www.datalight.com.

* cited by examiner

*Primary Examiner*—Stephen C Elmore
(74) *Attorney, Agent, or Firm*—Martine Penilla & Gencarella, LLP

(57) ABSTRACT

A storage device is provided. The storage device includes a memory that includes interleaved fast and slow pages and a controller. In response to a command from a host of the storage device the controller stores fast-reading data in the memory. If the fast and slow pages alternate, the controller stores the fast-reading data in the first pages alternately with filler data in the low pages, and if contiguous pluralities of the fast and slow pages alternate, the controller stores the fast reading data in the contiguous pluralities of the fast pages alternately with the filler data in the contiguous pluralities of the slow pages.

6 Claims, 2 Drawing Sheets

SYSTEMS FOR OPTIMIZING PAGE SELECTION IN FLASH-MEMORY DEVICES

RELATED APPLICATIONS

This patent application claims priority under 35 U.S.C. §119(e) to U.S. Provisional Application No. 60/939,090, filed May 21, 2007, which is hereby incorporated by reference in its entirety.

This patent application is related to U.S. Pat. No. 7,525,870, issued on Apr. 28, 2009, having the same inventor, which is entitled "METHODS FOR OPTIMIZING PAGE SELECTION IN FLASH-MEMORY DEVICES" and filed on the same day as the present application. That patent application, also claiming priority to U.S. Provisional Application No. 60/939,090, is incorporated in its entirety as if fully set forth herein.

FIELD AND BACKGROUND OF THE INVENTION

The present invention relates to systems for writing data into a flash-memory storage device in a way that optimizes the speed of reading data without sacrificing storage space.

Flash-memory storage devices are well-known in the art of computer engineering. Simple flash-memory cells typically contain one bit of data per cell, and are referred to in the art as SLCs (single-level cells). One of the main goals in developing flash-memory storage devices is to increase storage density in order to reduce the amount of silicon used, thereby reducing the cost of the device.

A well-known method for increasing the storage density in flash-memory storage devices is to implement what is referred to as MLCs (multi-level cells), which are based on establishing and utilizing three threshold voltage-levels, rather than one threshold voltage-level in each cell. MLC technology is described in an article published by Datalight Inc., Bothel, Wash. entitled "Technology Comparison—SLC and MLC Flash" (available at www.datalight.com), as well as taught by Tanaka, U.S. Pat. No. 6,643,188 (hereinafter referred to as Tanaka '188), hereby incorporated by reference as if fully set forth herein.

While doubling the storage capacity of the device, MLC technology requires more time to read the memory. One possible reason for the longer reading time is that the reading operation may require two voltage comparisons rather than one. The prior art teaches methods for writing at relatively fast (and slow) speeds to pages in MLC storage devices, but the prior art does not teach any methods for reading data from MLC devices at the high speeds that are typical for SLC storage devices.

The prior art teaches methods for overcoming the speed limitation of MLC storage devices by sacrificing the "slow pages" and using only the "fast pages" (defined below in the Summary). A prior-art example of such a method is disclosed by Lasser et al., US Patent Application No. 20060155919 (hereinafter referred to as Lasser '919), assigned to the assignee of the present invention, and hereby incorporated by reference as if fully set forth herein. This improvement in speed is provided at the expense of a significant loss of storage space. In such devices, the slower part of the storage area is not used at all, reducing the original storage capacity of the device.

It would be desirable to have a variable read-speed storage device in which part of the MLC data can be read much faster than other parts of the data, without wasting a significant part of the storage area by leaving the slower part unused.

SUMMARY OF THE INVENTION

It is the purpose of the present invention to provide systems for writing data into a flash-memory storage device in a way that optimizes the speed of reading data without sacrificing storage space.

For the purpose of clarity, several terms which follow are specifically defined for use herein. The term "storage level" is used herein to refer to a range of a physical value (typically voltage) in a storage cell that is associated with a logical value. In an SLC, there are two storage levels (e.g. 0 and 1, corresponding to zero-logic and one-logic, respectively), and in an MLC, there are 4 storage values (e.g. 0, 1, 2, and 3). The physics of storage levels is clearly described in Tanaka '188.

The term "fast page" is used herein to refer to a logical page in an MLC that is read relatively faster, in comparison to a slow page, due to fewer and/or shorter logical operations. The term "slow page" is used herein to refer to a logical page in an MLC that is read relatively slower, in comparison to a fast page, due to more and/or longer logical operations. The term "fast-reading data" is used herein to refer to data that is designated to be read at an optimal (i.e. fast) reading speed.

The term "filler data" is used herein to refer to data that is not designated to be read at an optimal reading speed, and can be stored in storage areas designated for slower reading. Filler data is stored in the slow pages of a block in a flash-memory storage device, while the fast pages are used for fast-reading data. Filler data does not have less importance than fast-reading data; filler data simply requires less stringent demands on the reading speed. The terms "move operation" and "move (data from one storage area to another)" are used herein to refer to any operation in which data is read from one storage area and is written into another area, whether the data of the first area is kept (an exemplary "copy" operation), or is discarded (an exemplary move operation).

The present invention teaches methods for using an MLC flash-memory storage device for the storage of data in which the data that requires fast reading is stored in fast pages, and the data that can afford slower reading is stored in slow pages.

It should be noted that the present invention is not limited to cells with two bits of data. There are higher level cells (e.g. "X4" cell technology, which utilizes four bits per cell, available from SanDisk Corporation, Milpitas, Calif.). The reading speed of devices having four bits per cell typically varies from bit to bit. In some cases, there may be four different reading speeds for the bits of a given cell (e.g. very fast, fast, slow, and very slow). Since pages have bits that are read at the same speed, devices of the present invention can allocate data to pages according to the speed that such pages are read (with four speeds to select from).

A typical distinction between the need for fast-reading data and slow-reading data (i.e. filler data) is the difference in the "user experience" between using an interactive program (e.g. Microsoft™ Outlook) and an off-line program (e.g. a defragmentation program). A user expects Outlook to load quickly in contrast to a defragmentation program (which the user can accept will load slowly). Such a user-experience consideration implies that it is rational to store, for example. Outlook files in fast pages, and defragmentation files in slow pages, rather than storing the files randomly.

In a preferred embodiment of the present invention, fast-reading data and filler data are sent from a host system to the storage device in an interleaved fashion, so that the storage device can store the fast-reading data to fast pages, and the filler data to slow pages, without necessitating an interim storage in the storage device.

In another preferred embodiment of the present invention, the storage device moves the filler data from an interim storage area to the slow pages of a new storage area, while writing fast-reading data into the fast pages of the new storage area.

In another preferred embodiment of the present invention, the storage device moves the fast-reading data from an interim storage area to the fast pages of a new storage area, while writing the filler data into the slow pages of the new storage area.

In another preferred embodiment of the present invention, the host system identifies data to be stored that requires fast reading. Such identification can be performed either interactively, according to a user request, or automatically, according to the type of application accessing the data, to the type of data, and/or to the history of handling the data, for example.

In another preferred embodiment of the present invention, the system includes a mechanism for interleaving fast-reading and filler data in fast and slow pages. Such interleaving can be accomplished by buffering the fast-reading data and filler data to be stored into two different buffers, and retrieving the data from each buffer segment for interleaving into the storage device.

In another preferred embodiment of the present invention, the data-storage management reconstructs a data object from data stored in fast pages by using a directory.

In another preferred embodiment of the present invention, the system stores some pages of filler data in fast pages in order to balance the number of fast and slow pages in the storage device. In such a situation, some data objects will be split between fast and slow pages: Such data objects are written on slow pages up to a point, and then the rest of the data object is written on fast pages.

It should be noted that, in the prior art, a data object is either stored alternately on fast and slow pages (in conventional MLC storage devices), or is strictly saved on one type of page (i.e. fast or slow), as disclosed in the Lasser '919. The "split storage" approach of the present invention, in which a portion of the data object is first stored on slow pages, and then the rest of the data object is stored on fast pages, is not known in the prior art.

In another preferred embodiment of the present invention, the system stores some pages of fast-reading data in slow pages in order to balance the number of fast and slow pages in the storage device, even though this will cause fast-reading data to be read slowly. In such a situation, some data objects will be split between fast and slow pages: Such data objects are written on fast pages up to a point, and then the rest of the data object is written on slow pages. The "split storage" approach of the present invention, in which a portion of the data object is first stored on fast pages, and then the rest of the data object is stored on slow pages, is not known in the prior art.

Therefore, according to the present invention, there is provided for the first time a computer-readable storage medium having computer-readable code embodied on the computer-readable storage medium, the computer-readable code including: (a) program code for interleaving fast-reading data and filler data in fast pages and slow pages, respectively.

According to the present invention, there is provided for the first time a computer-readable storage medium having computer-readable code embodied on the computer-readable storage medium, the computer-readable code including: (a) program code for reconstructing a data object from data stored only in designated pages.

Preferably, the designated pages are fast pages or slow pages.

According to the present invention, there is provided for the first time a computer-readable storage medium having computer-readable code embodied on the computer-readable storage medium, the computer-readable code including: (a) program code for at least one data object configured to be stored in fast pages and slow pages, wherein initial pages of at least one data object are stored only in primary pages, and the subsequent pages of at least one data object are stored only in secondary pages.

Preferably, the primary pages are slow pages and the secondary pages are fast pages.

Alternatively, the primary pages are fast pages and the secondary pages are slow pages.

These and further embodiments will be apparent from the detailed description and examples that follow.

BRIEF DESCRIPTION OF THE DRAWINGS

The present invention is herein described, by way of example only, with reference to the accompanying drawings, wherein.

DESCRIPTION OF THE PREFERRED EMBODIMENTS

The present invention relates to systems for writing data into a flash-memory storage device in a way that optimizes the speed of reading data without sacrificing storage space. The principles and operation for writing data into a flash-memory storage device in a way that optimizes the reading speed, according to the present invention, may be better understood with reference to the accompanying description and the drawings.

Figure 1:
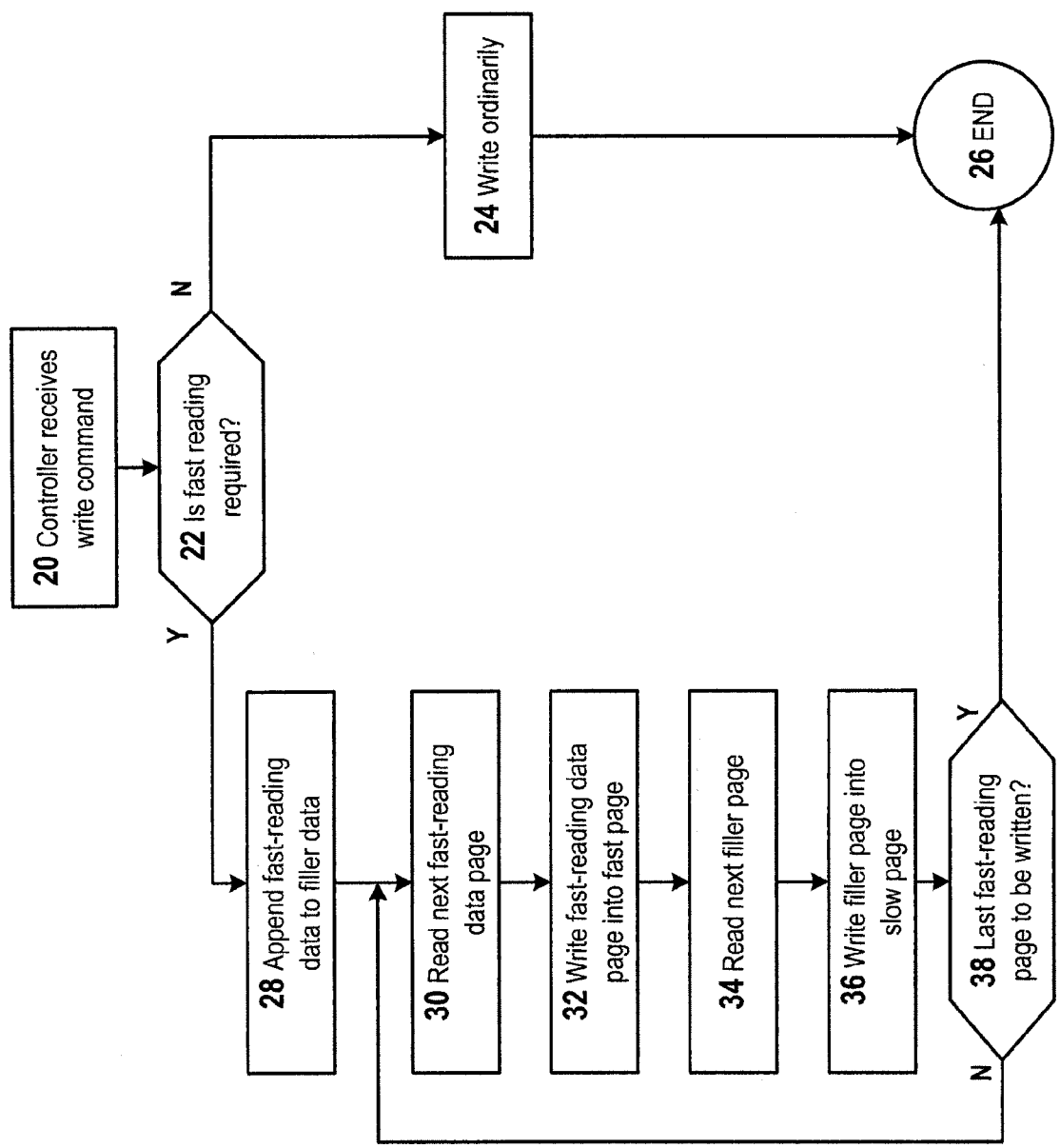
FIG. 1 is a simplified flowchart of the write process, according to preferred embodiments of the present invention.

Referring now to the drawings, FIG. 1 is a simplified flowchart of the write process, according to preferred embodiments of the present invention. The storage device receives a write command from the host system (Step 20). The write command is checked to see if fast reading is required (Step 22). If the command is an ordinary write command (i.e. does not require fast reading), the write command is performed in the regular way in which flash-memory storage devices allocate a page and write data (Step 24), and the process ends (Step 26).

If the command is not an ordinary write command (e.g. the write command includes an attribute that requires optimization of the writing for fast retrieval (i.e. fast reading)). In such a case, the fast-reading data is appended to filler data, typically retrieved from the storage device, so that the fast pages of the data are allocated to the optimized data, while the slow pages of the data are allocated to the filler data (Step 28). The controller of the storage device then reads one page of the optimized data (Step 30), and writes the page into a fast page in the storage device (Step 32). The controller then reads one page of the filler data (Step 34), and writes the filler data to the next slow page in the storage device (Step 36).

If the fast and slow pages are not alternating, but are rather arranged in pairs, quadruples, or any other sequence (e.g. slow-slow-fast-fast-slow-slow), the controller stores the optimized and filler data accordingly. The controller checks if there are more optimized pages to be written (Step 38). If there are more optimized pages to be written, the controller repeats the process (Steps 30-38). When all optimized data has been written to fast pages, the process ends (Step 26).

Figure 2:
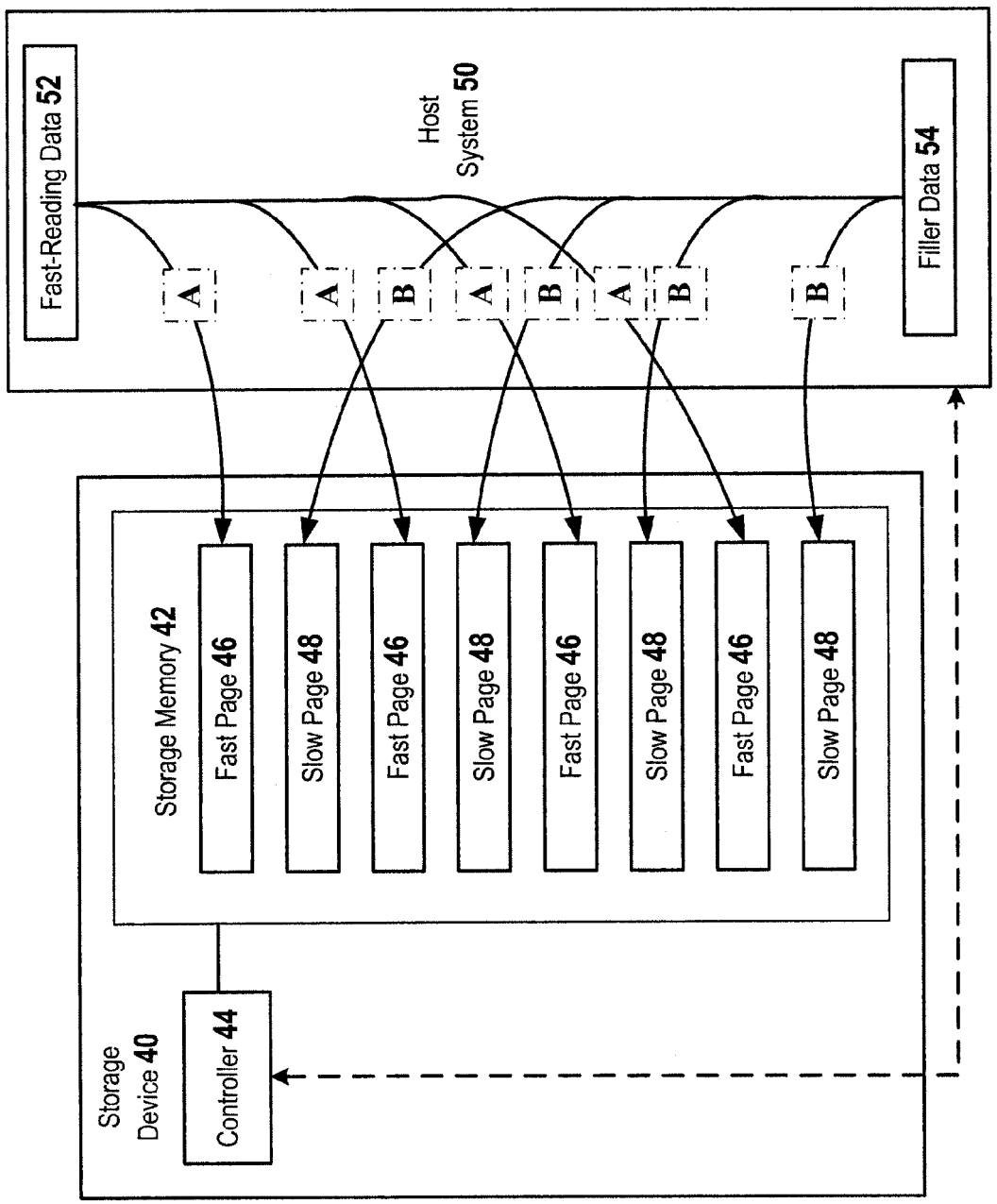
FIG. 2 is a simplified schematic block diagram of the storage pages in a storage device, according to preferred embodiments of the present invention.

FIG. 2 is a simplified schematic block diagram of the storage pages in a storage device, according to preferred embodiments of the present invention. A storage device 40, having a storage memory 42 and a storage controller 44, is shown in FIG. 2. Storage memory 42 has fast pages 46 and slow pages 48. A host system 50 is shown having fast-reading data 52 and filler data 54 that need to be written into storage memory 42. A write command A writes fast-reading data 52 into fast pages 46, and a write command B writes filler data 54 into slow pages 48.

While the invention has been described with respect to a limited number of embodiments, it will be appreciated that many variations, modifications, and other applications of the invention may be made.

What is claimed is:

1. A storage device comprising:
   (a) a memory that includes interleaved fast and slow pages; and
   (b) a controller that is operative, in response to a command from a host of the storage device to store fast-reading data in said memory:
   (i) if said fast and slow pages alternate, to store said fast-reading data in said first pages alternately with filler data in said low pages, and
   (ii) if contiguous pluralities of said fast and slow pages alternate, to store said fast reading data in said contiguous pluralities of said fast pages alternately with said filler data in said contiguous pluralities of said slow pages.

2. The storage device of claim 1, wherein said contiguous pluralities of said fast pages are pairs of said fast pages and said contiguous pluralities of said slow pages are pairs of said slow pages.

3. The storage device of claim 1, wherein said contiguous pluralities of said fast pages are quadruples of said fast pages and said contiguous pluralities of said slow pages are quadruples of said slow pages.

4. The storage device of claim 1, wherein said controller is operative to obtain said filler data from elsewhere in said memory.

5. The storage device of claim 1, wherein said memory is a flash memory and wherein said fast and slow pages alternate within a block of said flash memory.

6. The storage device of claim 5, herein said block is a MLC block.

* * * * *